United States Patent [19]
Dalmia

[11] Patent Number: 6,100,722
[45] Date of Patent: Aug. 8, 2000

[54] PHASE DETECTOR WITH EXTENDED LINEAR RANGE

[75] Inventor: Kamal Dalmia, Austin, Tex.

[73] Assignee: Cypress Semiconductor Corp., San Jose, Calif.

[21] Appl. No.: 09/362,478

[22] Filed: Jul. 28, 1999

Related U.S. Application Data

[60] Provisional application No. 60/104,486, Oct. 16, 1998.

[51] Int. Cl.[7] .......................... G01R 25/00; H03D 13/00
[52] U.S. Cl. ................................................................. 327/12
[58] Field of Search ................................. 327/2, 3, 7, 10, 327/12, 159, 163; 375/362

[56] References Cited

U.S. PATENT DOCUMENTS

| | | | |
|---|---|---|---|
| 5,301,196 | 4/1994 | Ewen et al. ........................ | 370/105.2 |
| 5,652,531 | 7/1997 | Co et al. ............................ | 327/12 |
| 5,789,947 | 8/1998 | Sato .................................. | 327/3 |
| 5,926,041 | 7/1999 | Duffy et al. ....................... | 327/12 |
| 5,939,901 | 8/1999 | Geddes ............................. | 327/3 |

OTHER PUBLICATIONS

U.S. application No. 09/216,465, Kamal Dalmia et al., filed Dec. 18, 1998, Phase Detector.
U.S. application No. 09/283,058, Kamal Dalmia, filed Apr. 1, 1999, Method, Architecture and Circuit for Half–Rate Clock and/or Data Recovery.
U.S. application No. 09/302,213, Kamal Dalmia, filed Apr. 29, 1999, Phase Detector with Extended Linear Range.
U.S. application No. 09/302,214, Kamal Dalmia, filed Apr. 29, 1999, Clock and Data Recovery PLL Based on Parallel Architecture.

*Primary Examiner*—My-Trang Nuton
*Attorney, Agent, or Firm*—Christopher P. Maiorana, P.C.

[57] ABSTRACT

A phase detector circuit comprising a control circuit, a pump-up circuit and a pump-down circuit. The control circuit may be configured to generate a control signal in response to (i) a data signal, (ii) a half-rate clock signal, and (iii) a quadrature of the half-rate clock signal. The pump-up circuit may be configured to generate a pump-up signal in response to (i) the data signal, and (ii) the control signal. The pump-down circuit may be configured to generate a pump-down signal in response to (i) the pump-up signal and (ii) the control signal.

14 Claims, 3 Drawing Sheets

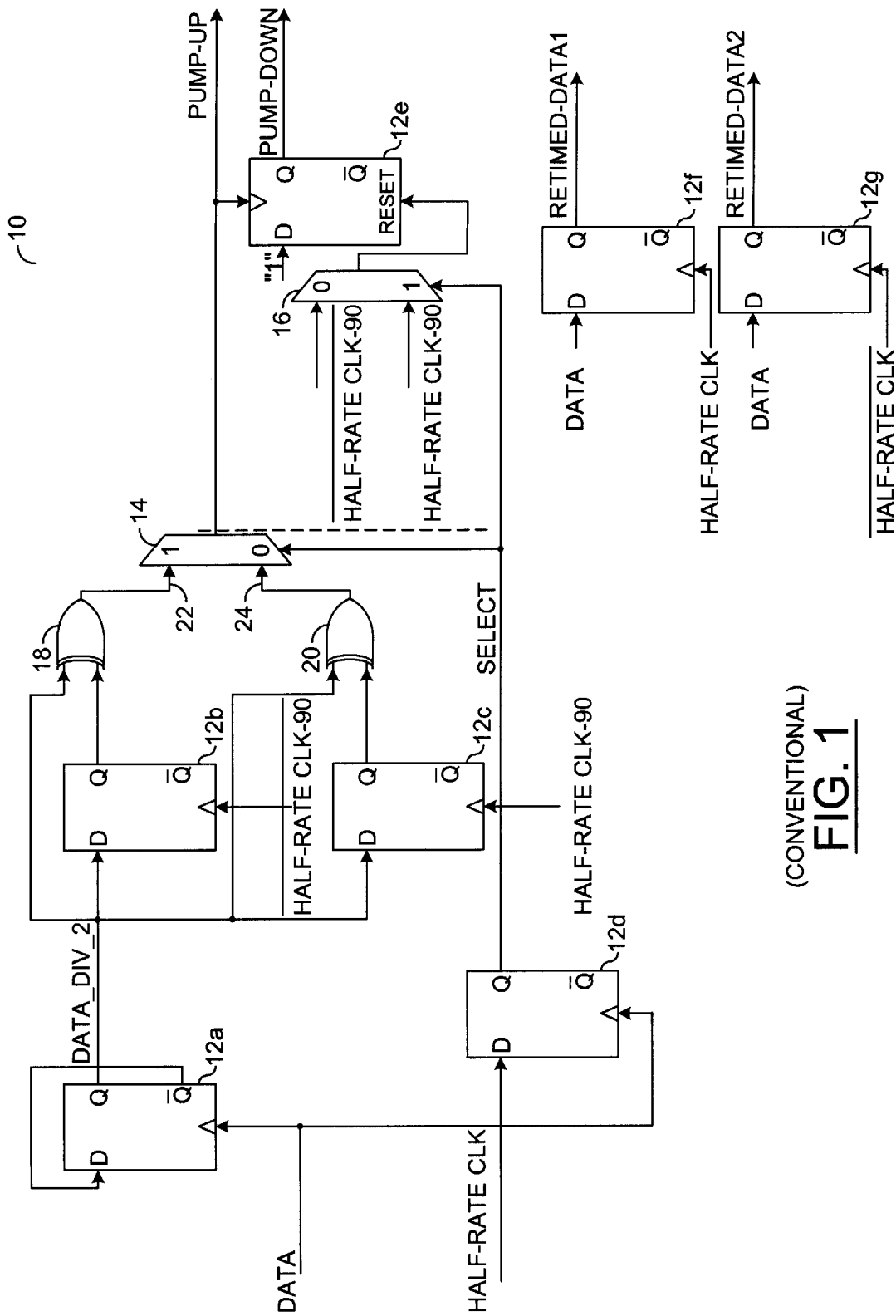
FIG. 1 (CONVENTIONAL)

PHASE DETECTOR WITH EXTENDED LINEAR RANGE

CROSS-REFERENCE TO RELATED APPLICATIONS

The present invention may relate to co-pending applications Ser. No. 60/104,486, filed Oct. 16, 1998, Ser. No. 09/216,465, filed Dec. 18, 1998, Ser. No. 09/283,058, filed Apr. 1, 1999, Ser. No. 09/302,213, filed Apr. 29, 1999, and Ser. No. 09/302,214, filed Apr. 29, 1999, which are each hereby incorporated by reference in their entirety.

FIELD OF THE INVENTION

The present invention relates to linear phase detectors generally and, more particularly, to a linear phase detector that may be used in an analog phase-locked loop (PLL) for data and/or clock recovery.

BACKGROUND OF THE INVENTION

Phase detectors are logic circuits used to generate pump-up and pump-down signals to control charge-pump circuits in a clock and data recovery PLL. Phase detectors can also generate recovered-data. As operating speeds of clock and data recovery units increase, the design of voltage-controlled oscillators and charge pump circuits becomes complicated and highly power consuming. The use of half-rate clock phase detectors can reduce the complexity and power demand of the associated charge pump circuits and voltage controlled oscillators.

Referring to FIG. 1, a circuit 10 illustrates a current architecture for a half-rate clock phase detector. The circuit 10 comprises a number of D flip-flops 12a–12g, a selector circuit 14, a selector circuit 16, an XOR gate 18 and an XOR gate 20.

The phase detector 10 generates a pump-up signal by first generating two internal pump-up signals 22, 24 and dynamically selecting one to be the final pump-up signal using a clock sampled by data as a reference. The phase detector 10 responds to only one edge of data transitions. Thus, to perform phase detection using both edges, four internal pump-up signals would have to be generated (two for each rising edge and two for each falling edge). The phase detector 10 may require an excessive number of gates due to the replication of the circuit to retain information in all data edges. The additional gates imply more power consumption and more space.

SUMMARY OF THE INVENTION

The present invention concerns a phase detector circuit comprising a control circuit, a pump-up circuit, and a pump-down circuit. The control circuit may be configured to generate a control signal in response to (i) a data signal, (ii) a half-rate clock signal, and (iii) a quadrature of the half-rate clock signal. The pump-up circuit may be configured to generate a pump-up signal in response to (i) the data signal, and (ii) the control signal. The pump-down circuit may be configured to generate a pump-down signal in response to (i) the pump-up signal and (ii) the control signal.

The objects, features and advantages of the present invention include providing a phase detector that may (i) use fewer components and less power to implement a half-rate phase detector that may generate nominally "bit-wide" pump-up and pump-down signals, (ii) implement a phase detector configured to dynamically select quadrature half-rate clock signals for generating pump-up and pump-down signals, and/or (iii) generate one pump-down signal from one pump-up signal.

BRIEF DESCRIPTION OF THE DRAWINGS

These and other objects, features and advantages of the present invention will be apparent from the following detailed description and the appended claims and drawings in which:

FIG. 1 is a block diagram of a half-rate clock phase detector;

DETAILED DESCRIPTION OF THE PREFERRED EMBODIMENTS

Figure 2:
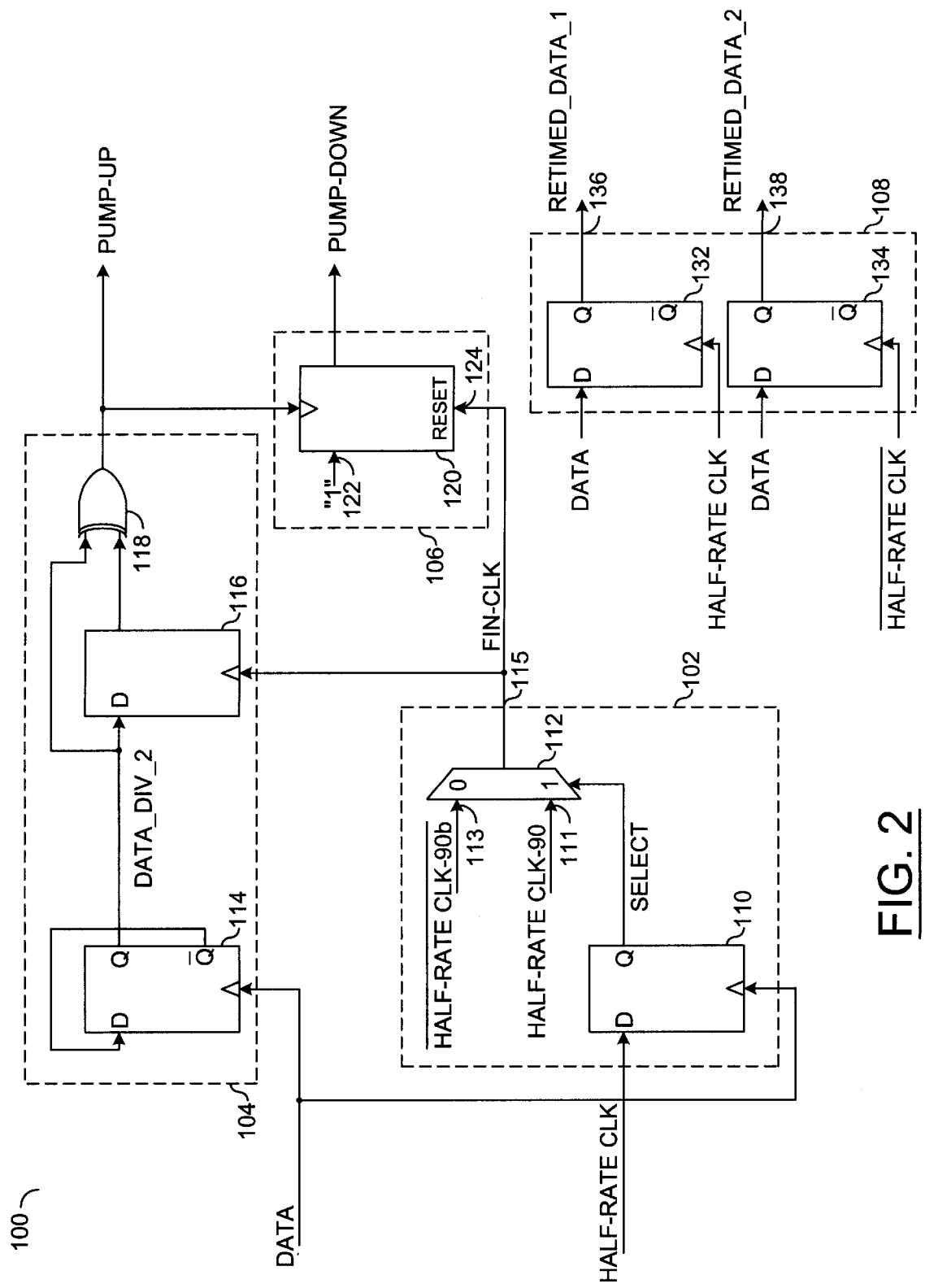
FIG. 2 is a block diagram of the preferred embodiment of the present invention.

Referring to FIG. 2, a block diagram of a circuit 100 is shown in accordance with a preferred embodiment of the present invention. The circuit 100 generally comprises a control circuit 102, a pump-up circuit 104, a pump-down circuit 106, and a data recovery circuit 108. The control circuit 102 generally comprises a flip-flop 110 and a multiplexor 112. The flip-flop 110 may be implemented, in one example, as a D-type flip-flop. Alternatively, the flip-flop may be implemented as a T-type flip-flop. The flip-flop 110 generally receives a data input signal (e.g., DATA) at a clock input. The flip-flop 110 generally receives a signal (e.g., HALF-RATE_CLK) at a D input. The flip-flop 110 generally presents a signal (e.g., SELECT), which may be used as a control signal, at a Q output.

The multiplexor 112 generally receives the signal SELECT at a control input, a quadrature of the signal HALF-RATE_CLK (e.g., HALF-RATE_CLK-90) at an input 111, and a digital complement of the quadrature of the signal HALF-RATE_CLK (e.g., HALF-RATE_CLK-90b) at an input 113. The multiplexor 112 generally presents a signal (e.g., FIN_CLK) at an output 115. The signal FIN_CLK may be a control signal.

The pump-up circuit 104 generally comprises a flip-flop 114, a flip-flop 116, and a gate 118. The flip-flops 114, 116 may be implemented, in one example, as D-type flip-flops. Alternatively, the flip-flops 114, 116 may be implemented as T-type flip-flops. The flip-flop 114 generally receives the data input signal DATA at a clock input. The flip-flop 114 generally presents a signal (e.g., DATA_DIV_2) at a Q output. A Qb output (e.g., a digital complement of the Q output) is generally presented to a D input of the flip-flop 114. The signal DATA_DIV_2 is generally presented to a D input of the flip-flop 116 and a first input of gate 118. In one example, the gate 118 may be implemented as an XOR gate. However, other gates may be implemented accordingly to meet the design criteria of a particular implementation.

The flip-flop 116 has an output that generally presents a signal to a second input of the gate 118. The flip-flop 116 generally receives the signal FIN_CLK at a clock input. An output of the gate 118 generally presents a signal (e.g., PUMP-UP).

The pump-down circuit 106 generally comprises a flip-flop 120. The flip-flop 120 may be, in one example, a D-type flip-flop with a reset input. The flip-flop 120 generally receives a digital high or "1" at a first input 122. The first input 122 may be a D-input. The flip-flop 120 generally receives the signal FIN_CLK at a second input 124. The second input 124 may be a reset input. A clock input of the flip-flop 120 generally receives the signal PUMP-UP. An output of the flip-flop 120 generally presents a signal (e.g., PUMP-DOWN).

The data recovery circuit 108 comprises a flip-flop 132 and a flip-flop 134. The flip-flops 132, 134 may be implemented, in one example, as D-type flip-flops. Alternatively, the flip-flops 132, 134 may be implemented as T-type flip-flops. The flip-flop 132 generally receives the signal HALF-RATE_CLK at a clock input, the signal DATA at a data input and may present a first retimed data signal (e.g., RETIMED_DATA_1) at an output 136. The flip-flop 134 generally receives a digital complement of the signal HALF-RATE_CLK at a clock input, the signal DATA at a data input and may present a second retimed data signal (e.g., RETIMED_DATA_2) at an output 138.

In general, the circuit 100 provides a 2× parallel sampling phase-detector that generally responds to the signals HALF-RATE_CLK and HALF-RATE_CLK-90. The flip-flop 114 may act as a data divider to generate the signal DATA_DIV_2, which generally has edges that respond to one edge (e.g., the rising edge) of the signal DATA. The signal DATA_DIV_2 may be used to generate the signal PUMP-UP for each edge. The flip-flop 116 and the XOR gate 118 may be used to generate the signal PUMP-UP. Depending upon the polarity of the signal DATA and the signal HALF-RATE_CLK, the multiplexor 112 may select the signal HALF-RATE_CLK-90 or the digital complement of the signal HALF-RATE_CLK-90 as the signal FIN_CLK. The flip-flop 116 may use the signal FIN_CLK in generating the signal PUMP-UP. The flip-flop 120 may generate the signal PUMP-DOWN in response to the signal PUMP-UP and the signal FIN_CLK.

The generation of the signal PUMP-UP may be implemented, in one example, by the following method: (i) generate a positive transition for each edge of the signal DATA_DIV_2, (ii) sample the signal HALF-RATE_CLK with the signal DATA (e.g., using flip-flop 110), (iii) if the signal HALF-RATE_CLK is sampled HIGH (e.g., by flip-flop 110), select the signal HALF-RATE_CLK-90 (e.g., using multiplexor 112), (iv) if the signal HALF-RATE_CLK is sampled LOW (e.g., by flip-flop 110), select the digital complement of the signal HALF-RATE_CLK-90 (e.g., using multiplexor 112), and (v) generate a negative transition in response to the signal selected in steps (iii) and (iv).

The signal PUMP-DOWN may be generated, in one example, by the following method: (i) start the signal PUMP-DOWN on one edge (e.g., the falling edge) of the signal PUMP-UP (e.g., using flip flop 120),(ii) if the signal HALF-RATE_CLK is sampled HIGH (e.g., by the flip-flop 110), select the signal HALF-RATE_CLK-90 as the signal FIN_CLK (e.g., using the multiplexor 112), (iii) if the signal HALF-RATE_CLK is sampled LOW (e.g., by the flip-flop 110), select the digital complement of the signal HALF-RATE_CLK-90 as the signal FIN_CLK (e.g., using the multiplexor 112), and (iv) stop the signal PUMP-DOWN in response to the signal FIN_CLK as selected in steps (i) or (ii).

A retimed data signal may be generated, in one example, by the following method: (i) sample the signal DATA with the signal HALF-RATE_CLK to generate the signal RETIMED_DATA_1 (e.g., using flip flop 132), and (ii) sample the signal DATA with the digital complement of the signal HALF-RATE_CLK to generate the signal RETIMED_DATA_2 (e.g., using flip-flop 134). Two data streams may be generated, one on each edge (i.e., rising and falling edges) of the signal HALF-RATE_CLK.

In general, the phase detector 100 responds to only one direction of edge transition (e.g., rising edge) of the signal DATA. However, in design applications requiring phase detection using both edges, the circuit 100 may be replicated such that there are two phase detectors which may respond to the rising and falling edges of the signal DATA, respectively.

Figure 3:
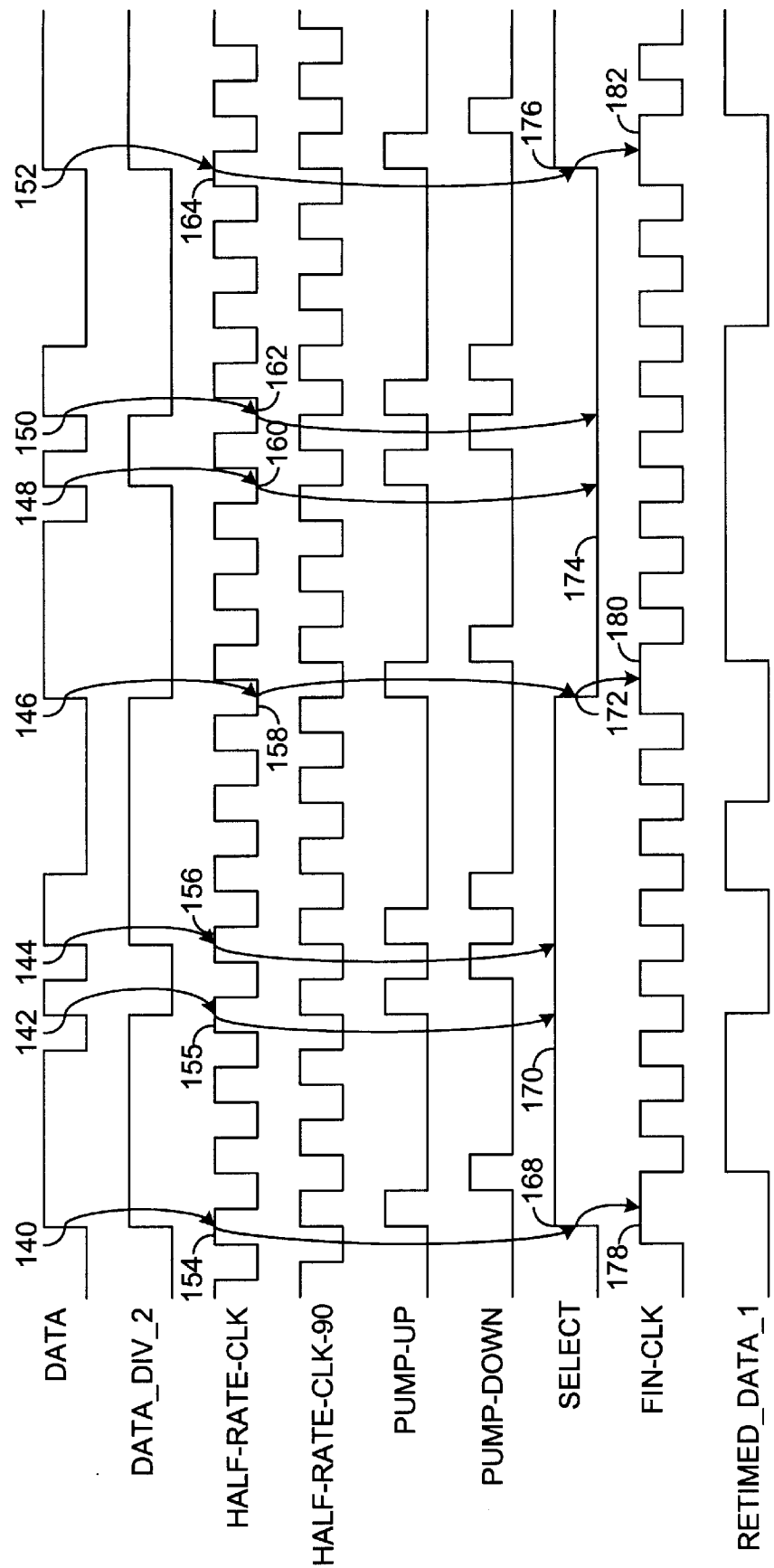
FIG. 3 is a timing diagram of various waveforms of the circuit of FIG. 2.

Referring to FIG. 3, a timing diagram of the circuit in FIG. 2 generally illustrates an example of the various signals and transitions of the circuit 100. FIG. 3 illustrates the relationship between the signal PUMP-DOWN and the signal PUMP-UP. There may be one signal PUMP-DOWN for each signal PUMP-UP. The signal DATA_DIV_2 may have a transition for each rising edge of the signal DATA. A dynamic selection of a quadrature of the signal HALF-RATE_CLK may be illustrated as follows. If on a rising edge of the signal DATA 140, the signal HALF-RATE_CLK is at a "high" level 154, then the signal SELECT generally makes a positive transition 168 to a "high" level 170, resulting in the signal FIN_CLK becoming equivalent to the signal HALF_RATE_CLK-90 178. If on a rising edge of the signal DATA 146, the signal HALF-RATE_CLK is at a "low" level 158, then the signal SELECT generally makes a negative transition 172 to a "low" level, resulting in the signal FIN_CLK becoming equivalent to the digital complement of the signal HALF-RATE_CLK-90 180. In general, no change in the signal SELECT occurs when the level of the signal HALF-RATE_CLK is the same as at the previous rising transition of the signal DATA 142, 155, 170.

While the invention has been particularly shown and described with reference to an example of a preferred embodiment thereof, it will be understood by those skilled in the art that various changes in form and details may be made without departing from the spirit and scope of the invention.

What is claimed is:

1. A phase detector circuit comprising:

a control circuit configured to generate a first control signal in response to (i) a data signal; (ii) a half-rate clock signal; and (iii) a quadrature of a half-rate clock signal;

a pump-up circuit configured to generate a pump-up signal in response to (i) said data signal, and (ii) said first control signal; and a pump-down circuit configured to generate a pump-down signal in response to (i) said pump-up signal and (ii) said first control signal.

2. The circuit according to claim 1, wherein said pump-up signal and said pump-down signal are bit-wide signals.

3. The circuit according to claim 1 further comprising:

a data recovery circuit configured to generate a first retimed data signal in response to (i) said data signal and (ii) said half-rate clock signal.

4. The circuit according to claim 3, wherein said data recovery circuit further comprises:

a second circuit configured to generate a second retimed data signal in response to a digital complement of said half-rate clock signal, wherein said second retimed data signal operates on positive transitions of said half-rate clock and said first retimed data signal operates on negative transitions of said half-rate clock signal.

5. The circuit according to claim 1, wherein said control circuit further comprises:

a selection device configured to select either (i) said quadrature of said half-rate clock signal, or (ii) a digital complement of said quadrature of said half-rate clock signal as said first control signal, in response to a gated version of said half-rate clock signal.

6. The circuit according to claim 1, wherein said pump-down circuit further comprises:

a memory device configured to generate said pump down signal in response to (i) said pump-up signal and (ii) said first control signal.

7. The circuit according to claim 1, wherein:

said pump-up circuit is further configured to generate the pump-up signal in response to a positive or a negative transition of the data signal.

8. A phase detector circuit comprising:

means for generating a control signal in response to (i) a data signal, (ii) a half-rate clock signal, and (iii) a quadrature of said half-rate clock signal;

means for generating a pump-up signal in response to (i) a data signal, and (ii) said control signal; and means for generating a pump-down signal in response to (i) said pump-up signal and (ii) said control signal.

9. A phase detector circuit as in claim 8 further comprising:

means for generating one or more retimed data signals in response to (i) said data signal, and (ii) said half-rate clock signal.

10. A method for controlling a phase detector comprising the steps of:

(A) generating a control signal in response to (i) a data signal, (ii) a half-rate clock signal, and (iii) a quadrature of said half-rate clock signal;

(B) generating a pump-up signal in response to (i) said data signal, and (ii) said control signal; and (C) generating a pump-down signal in response to (i) said pump-up signal and (ii) said control signal.

11. The method according to claim 10 further comprising the step of:

(D) generating a first retimed data signal in response to (i) said data signal and (ii) said half-rate clock signal.

12. The method according to claim 11, wherein step (D) further comprises:

generating a second retimed data signal in response to a digital complement of said half-rate clock signal, wherein said second retimed data signal operates on positive transitions of said half-rate clock and said first retimed data signal operates on negative transitions of said half-rate clock signal.

13. The method according to claim 12, wherein said pump-up signal is generated in response to the following sub-steps:

(B-1) generating a positive transition for each edge of a divided data signal;

(B-2) sampling the half-rate clock signal with the data signal;

(B-3) if the half-rate clock signal is sampled at a first state, selecting the quadrature of the half-rate clock signal or, if the half-rate clock signal is sampled at a second state, selecting a digital complement of the quadrature of the half-rate clock signal; and (B-4) generating a negative transition in response to the signal selected in sub-step B-3.

14. The method according to claim 13, wherein the pump-down signal is generated in response to the following sub-steps:

(C-1) starting the pump-down signal on one edge of the pump-up signal;

(C-2) if the half-rate clock signal is sampled at said first state, selecting the quadrature of the half-rate clock signal to generate the pump-down signal;

(C-3) if the half-rate clock signal is sampled at said second state, selecting the digital complement of the half-rate clock signal to generate the pump-down signal; and (C-4) stopping the pump-down signal in response to the signal selected in sub-step (C-2) or sub-step (C-3).

* * * * *